United States Patent
Kikuma et al.

(10) Patent No.: US 6,818,999 B2
(45) Date of Patent: Nov. 16, 2004

(54) SEMICONDUCTOR DEVICE HAVING MULTIPLE SEMICONDUCTOR CHIPS IN A SINGLE PACKAGE

(75) Inventors: Katsuhito Kikuma, Kawasaki (JP); Yuji Akashi, Kasugai (JP); Takeshi Ikuta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/339,678

(22) Filed: Jan. 10, 2003

(65) Prior Publication Data

US 2003/0180988 A1 Sep. 25, 2003

(30) Foreign Application Priority Data

Mar. 20, 2002 (JP) ........................................ 2002-079240

(51) Int. Cl.[7] .............................................. H01L 23/48
(52) U.S. Cl. ...................... 257/777; 257/778; 257/787; 438/127
(58) Field of Search ............................... 257/773, 777, 257/778, 787; 438/107, 127

(56) References Cited

U.S. PATENT DOCUMENTS

| | | | | |
|---|---|---|---|---|
| 5,239,198 A | * | 8/1993 | Lin et al. | 257/693 |
| 6,104,084 A | * | 8/2000 | Ishio et al. | 257/666 |
| 6,118,184 A | * | 9/2000 | Ishio et al. | 257/787 |
| 6,316,838 B1 | * | 11/2001 | Ozawa et al. | 257/778 |
| 6,376,905 B2 | * | 4/2002 | Hisano et al. | 257/690 |
| 6,414,384 B1 | * | 7/2002 | Lo et al. | 257/685 |
| 6,569,709 B2 | * | 5/2003 | Derderian | 438/109 |

* cited by examiner

Primary Examiner—Richard Elms
Assistant Examiner—Christian D. Wilson
(74) Attorney, Agent, or Firm—Westerman, Hattori, Daniels & Adrian, LLP

(57) ABSTRACT

A semiconductor device of MCP structure, in which multiple semiconductor chips are provided in a single package and a method of manufacturing the same, that prevents damage of semiconductor chip that does not require burn-in and ensures the initial reliability of the semiconductor chip that requires the burn-in, are provided. The method has the steps of resin sealing and packaging the semiconductor chip that requires the burn-in and performing the burn-in to such packaged semiconductor chip; and mounting the semiconductor chip evaluated to be non-defective in the burn-in to the substrate along with the semiconductor chip not requiring the burn-in.

5 Claims, 12 Drawing Sheets

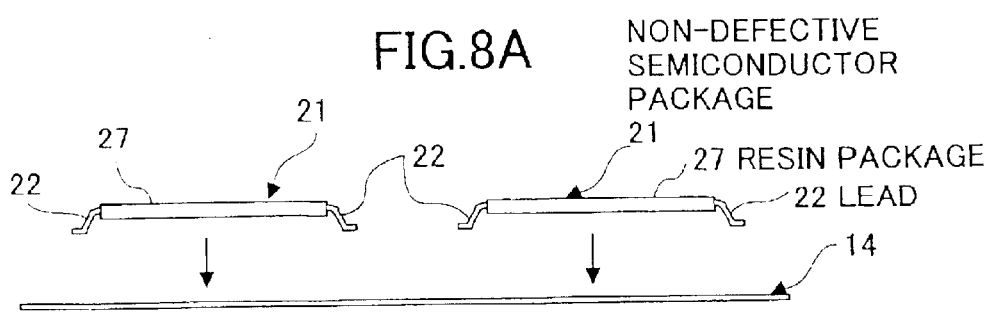
FIG.8A NON-DEFECTIVE SEMICONDUCTOR PACKAGE / 27 RESIN PACKAGE / 22 LEAD
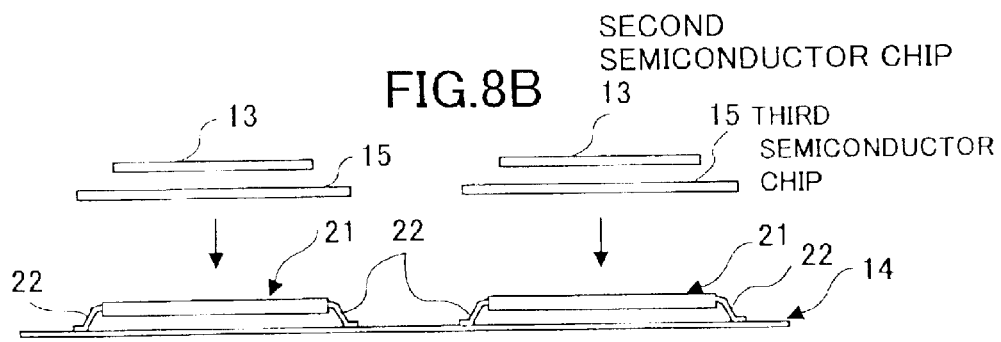
FIG.8B SECOND SEMICONDUCTOR CHIP / 15 THIRD SEMICONDUCTOR CHIP
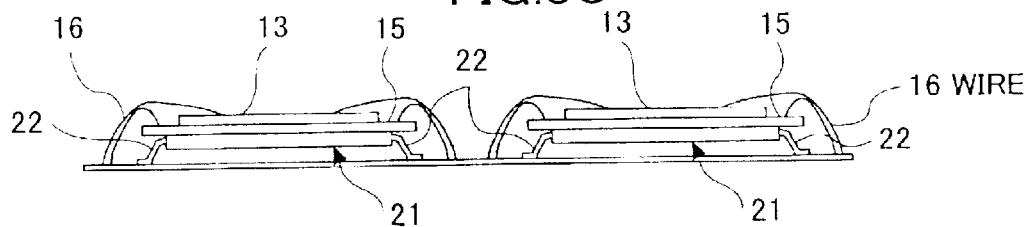
FIG.8C / 16 WIRE
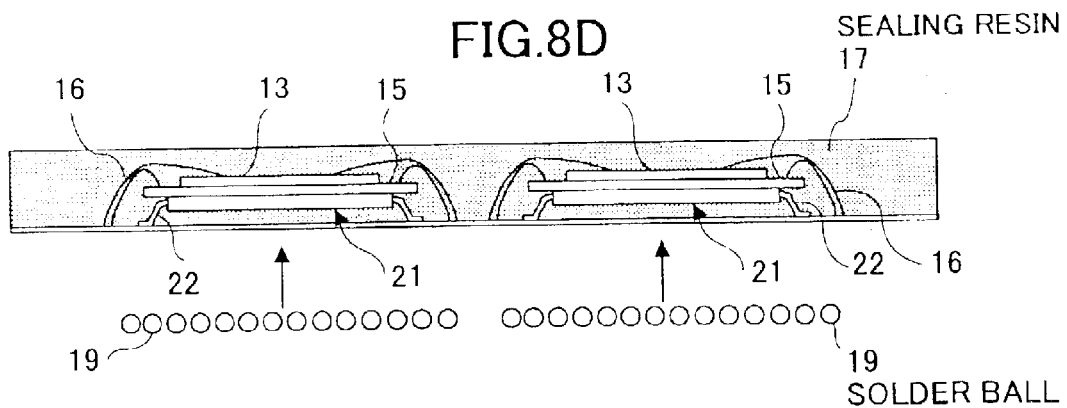
FIG.8D SEALING RESIN / 19 SOLDER BALL
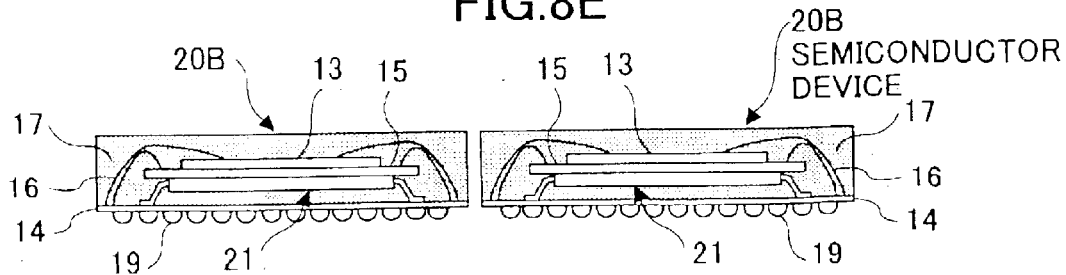
FIG.8E 20B SEMICONDUCTOR DEVICE

SEMICONDUCTOR DEVICE HAVING MULTIPLE SEMICONDUCTOR CHIPS IN A SINGLE PACKAGE

BACKGROUND OF THE INVENTION

This application claims the benefit of Japanese Patent Application No. 2002-079240 filed Mar. 20, 2002 in the Japanese Patent Office, the disclosure of which is hereby incorporated by reference.

1. Field of the Invention

The present invention generally relates to semiconductor devices and methods of manufacturing the same, and more particularly to a semiconductor device of MCP (Multi Chip Package) structure in which multiple semiconductor chips are provided in a single package and a method of manufacturing the same.

2. Description of the Related Art

Currently, compact electronic equipment such as mobile devices and the like is becoming smaller, and as a result the components built in to the equipment are also becoming smaller.

Therefore, a semiconductor device of MCP structure, in which multiple semiconductor chips are arranged intensively in a single package, has gained attention as a way to decrease the mounting area of the semiconductor device, which is the main component of such equipment.

FIG. 1 and FIG. 2 show an example of a conventional semiconductor device of MCP structure. The semiconductor device 1A shown in FIG. 1 is configured with multiple (two of which are shown in the figure) semiconductor chips 3 and 4 placed one on top of the other. In other words, the first semiconductor chip 3 is first arranged on top of a substrate 2, and then the second semiconductor chip 4 is placed on top of the first semiconductor chip 3 (this type of MCP is referred to as the stack type).

The first and the second semiconductor chips 3 and 4 are electrically connected to the substrate 2 by means of wires 5. Furthermore, a sealing resin 6 is molded to the substrate 2 and thus the semiconductor chips 3 and 4 as well as the wires 5 are all protected by this sealing resin 6. Solder balls 7 or the external connecting terminals are arranged on the under surface of the substrate 2. The solder balls 7 are connected to the wires 5 through wiring and through-holes formed in the substrate 2.

A semiconductor device 1B shown in FIG. 2 is configured with multiple (two of which are shown in the figure) semiconductor chips 3 and 4 arranged next to each other on the substrate 2 in the horizontal direction thereof (this type of MCP is referred to as the plane type). The first and the second semiconductor chips 3 and 4 are electrically connected to the substrate 2 by means of wires 5. Furthermore, the sealing resin 6 is molded to the substrate 2, and thus the semiconductor chips 3 and 4 as well as the wires 5 are all protected by this sealing resin 6. The solder balls 7 or the external connecting terminals are arranged on the under surface of the substrate 2. The solder balls 7 are connected to the wires 5 through wiring and through-holes formed in the substrate 2.

The semiconductor chips 3 and 4 on the semiconductor devices 1A and 1B of MCP structure are generally manufactured using only the non-defective chips that have been previously tested. However, if the semiconductor chips 3 and 4 to be used are in their early stage of development, or if there is a technical problem on the semiconductor chips themselves, the reliability of the semiconductor device can not be ensured by conducting only the usual test process. An example of this is a memory using the DRAM cell core technique. In such a case, an acceleration test carried out by heating to remove the initial defective semiconductor chips, referred to as the burn-in, is required.

FIG. 3 and FIG. 4 show manufacturing processes of the conventional semiconductor devices 1A and 1B of MCP structure. FIG. 3 shows the manufacturing processes of the semiconductor devices 1A and 1B, and FIG. 4 shows the processing of each of the manufacturing processes.

In steps S10A through S12A (a step is represented by S in the figure), the first semiconductor chip 3 is manufactured. In S10B through 12B, the second semiconductor chip 4 is manufactured. To manufacture each of the semiconductor chips 3 and 4, wafers with each semiconductor chips 3 and 4 are first formed (S10A and S10B), respectively. Subsequently, dicing is conducted to singularize the wafers into individual semiconductor chips 3 and 4 (S11A and S11B), thus manufacturing the first and the second semiconductor chips 3 and 4 (S12A and S12B).

After the first semiconductor chip 3 requiring the burn-in and the second semiconductor chip 4 not requiring the burn-in are manufactured, respectively, the first and the second semiconductor chips 3 and 4 are mounted to the substrate (S13). When doing so, the first and the second semiconductor chips 3 and 4 are stacked on the substrate 2, in the semiconductor device 1A shown in FIG. 1; and the first and the second semiconductor chips 3 and 4 are mounted side by side on the substrate 2, in the semiconductor device 1B shown in FIG. 2.

The wires 5 are then bonded between each of the semiconductor chips 3 and 4, and the substrate 2 (S14). Subsequently, resin sealing is performed on the substrate 2, and the sealing resin 6 is formed (S15). The substrate provided with the sealing resin 6 is then singularized into individual semiconductor devices 1A and 1B by dicing (S16) thus manufacturing the semiconductor devices 1A and 1B (S17).

In the semiconductor devices 1A and 1B of MCP structure, in which multiple semiconductor chips 3 and 4 are arranged, the semiconductor chip 3 requiring the burn-in and the semiconductor chip 4 not requiring the burn-in may be co-mounted on one of the semiconductor device 1A or 1B, as discussed above.

In order to guarantee the reliability of such semiconductor device 1A or 1B, it becomes necessary to conduct the burn-in to the semiconductor chip 3 requiring the burn-in. Therefore, in the semiconductor device 1A or 1B, where both the semiconductor chip 3 requiring the burn-in and the semiconductor chip 4 not requiring the burn-in co-exist, the burn-in is performed to remove the initially defective ones of the first semiconductor chip 3 (S18). Then, the result obtained from the burn-in is evaluated, and if processing failure is found in the first semiconductor chip 3, the semiconductor device provided with such first semiconductor chip 3 is removed.

Next, a final evaluation test, for example, the electrical property test and the appearance test, is performed (S20). If a defective device is found, such device is removed (S21). By performing each of the above processes, the semiconductor device can be completed.

However, in a semiconductor device 1A where the first semiconductor chip 3 and the second semiconductor 4 chip are arranged on the substrate 2, and sealed by the sealing resin 6 as in the prior art, the performance of the burn-in to the first semiconductor chip 3 causes the heat to also be applied to the second semiconductor chip 4 not requiring the burn-in. Thus, during the burn-in, there is a possibility that the second semiconductor chip 4 deteriorates or is destroyed.

As means to avoid such problems, a method in which the burn-in is performed to the first semiconductor chip 3, requiring the burn-in, before mounting the first-semiconductor chip 3 to the semiconductor device 1A or 1B, i.e., when on the wafer (wafer level burn-in) has been considered. However, even when using such a method, new problems, such as, the necessity of a circuit for wafer level burn-in to be incorporated in each of the semiconductor chips, the necessity of a large wafer level burn-in device, and low through-put arise, and the wafer level burn-in becomes difficult to perform.

SUMMARY OF THE INVENTION

Accordingly, it is a general object of the present invention to provide, in view of the above shortcomings, a semiconductor device and a method of manufacturing a semiconductor device that prevent damage to the semiconductor chip not requiring the burn-in while still ensuring the initial reliability of the semiconductor chip requiring the burn-in.

More particularly, it is a specific object of the present invention to provide a method of manufacturing a semiconductor device having the steps of performing a test on a first semiconductor chip; sealing the first semiconductor chip, determined to be non-defective in the test, to a package; mounting the first semiconductor chip that is sealed to the package onto a substrate along with a second semiconductor chip not requiring a test; and sealing the first semiconductor chip sealed to the package and the second semiconductor chip mounted onto the substrate with sealing resin.

The present invention further achieves the above object by providing a semiconductor device having a first semiconductor package having a first semiconductor chip sealed-to a resin package; a second semiconductor chip not being resin sealed; and a substrate on which the first semiconductor package and the second semiconductor chip are mounted; wherein the first semiconductor package and the second semiconductor chip are further sealed with resin.

According to the present invention, since the semiconductor device is manufactured by mounting the first semiconductor chip, determined to be non-defective, onto the substrate along with the second semiconductor chip not requiring the test, there is no longer any need to perform a test on the semiconductor chip after the first and the second semiconductors are mounted onto the substrate. Thus, compared to a method of performing a test after mounting the first and the second semiconductor chips onto the substrate, the yield of the semiconductor device is improved because the second semiconductor chip is not damaged by the test.

The first semiconductor chip, determined to be non-defective in the test, is mounted to the substrate in a state sealed to a package, and thus compared to being mounted in a bare-chip state, the first semiconductor chip is prevented from being damaged during mounting and the yield of the semiconductor device is further improved.

Furthermore, as the first semiconductor chip and the second semiconductor chip are sealed with the sealing resin, the strength of each of the semiconductor chips against the atmosphere in which the semiconductor device is situated and against external force increases and the reliability of the semiconductor device to be manufactured is improved.

According to the present invention, the generation of stress caused by the difference in thermal expansion between the package that seals the first semiconductor chip and the sealing resin that seals the first semiconductor package and the second semiconductor chip can be prevented. Thus, damage such as cracks is prevented from forming at the interface between the package and the sealing resin and the reliability of the semiconductor device to be manufactured is improved.

According to the present invention, as the package and the sealing resin are made of the same material, the generation of stress caused by the difference in thermal expansion between the two is prevented. Thus, damage such as cracks is prevented from forming at the interface between the package and the sealing resin and the reliability of the semiconductor device to be manufactured is improved. Furthermore, because the package and the sealing resin are made of the same material, the adhesion between the two is improved and thus gaps are prevented from forming at or water is prevented from entering into the interface of the package and the sealing resin.

According to the present invention, the reliability of the semiconductor device is improved.

According to the present invention, by stacking the first semiconductor chip and the second semiconductor chip, and by mounting the semiconductor chips one each to the front and the back surface of the substrate, the semiconductor device having such high reliability as described above can be miniaturized.

BRIEF DESCRIPTION OF THE DRAWINGS

FIGS. 8A through 8E are diagrams showing the manufacturing method of the semiconductor device according to a second embodiment of the present invention in accordance with the processing of manufacturing;

DESCRIPTION OF THE PREFERRED EMBODIMENTS

The embodiment of the present invention is explained in conjunction with the figures.

Figure 1:
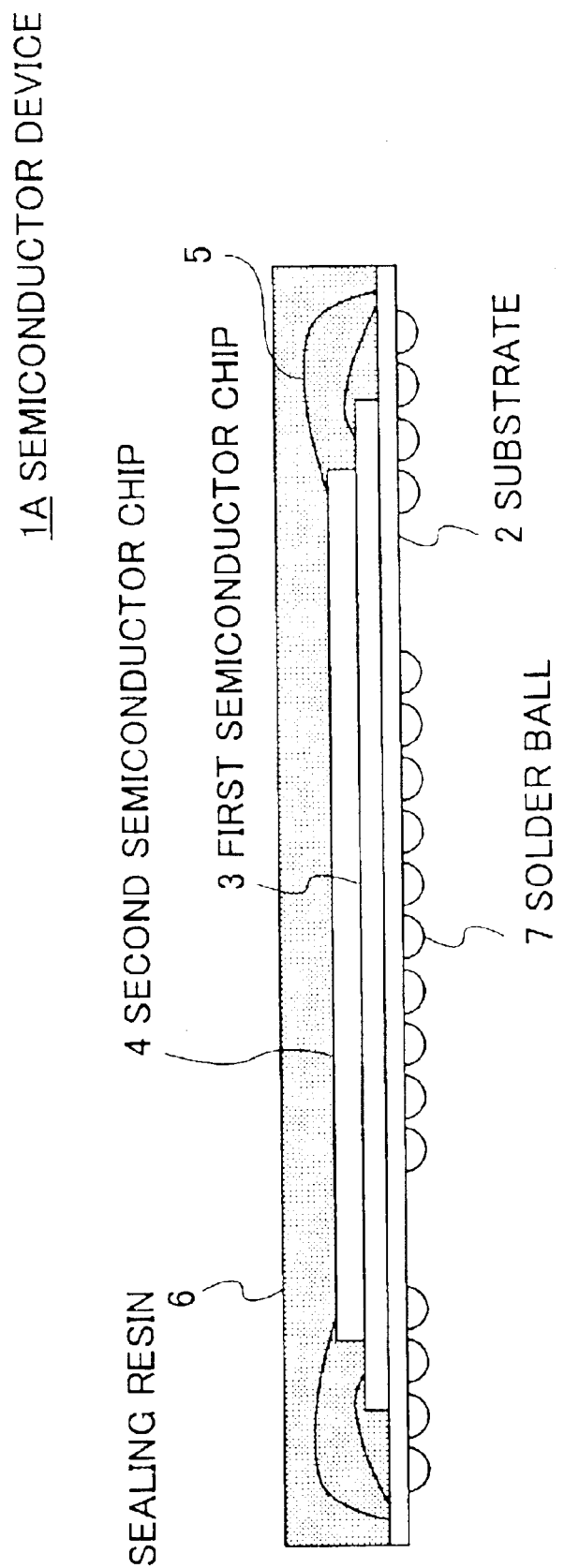
FIG. 1 is a diagram showing a conventional stack type semiconductor device.
Figure 2:
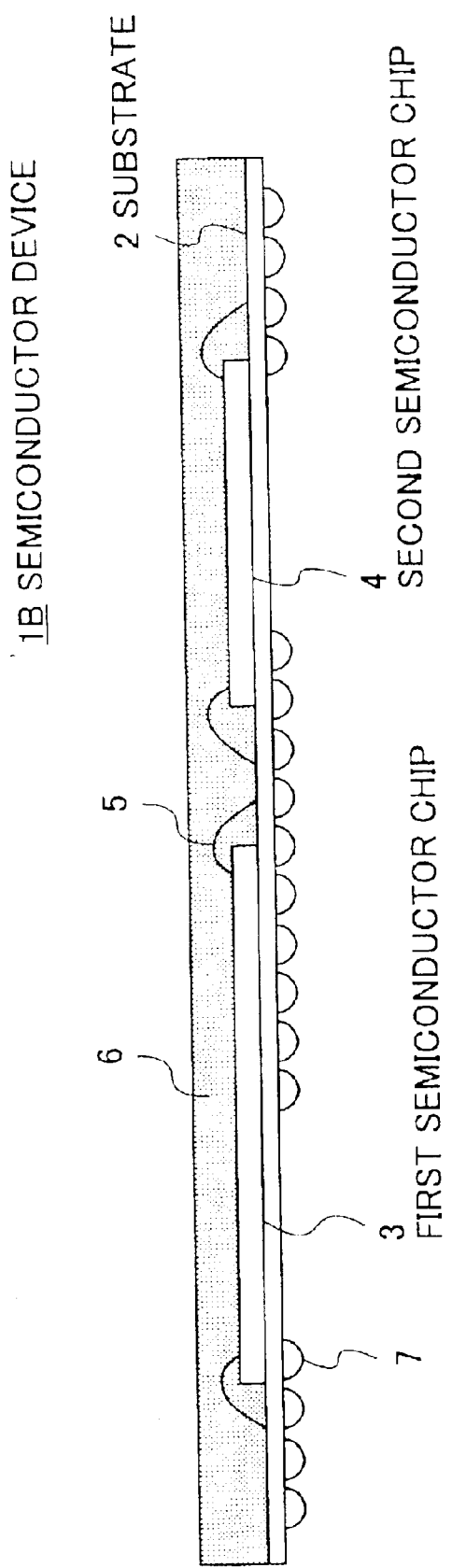
FIG. 2 is a diagram showing a conventional plane type semiconductor device.
Figure 3:
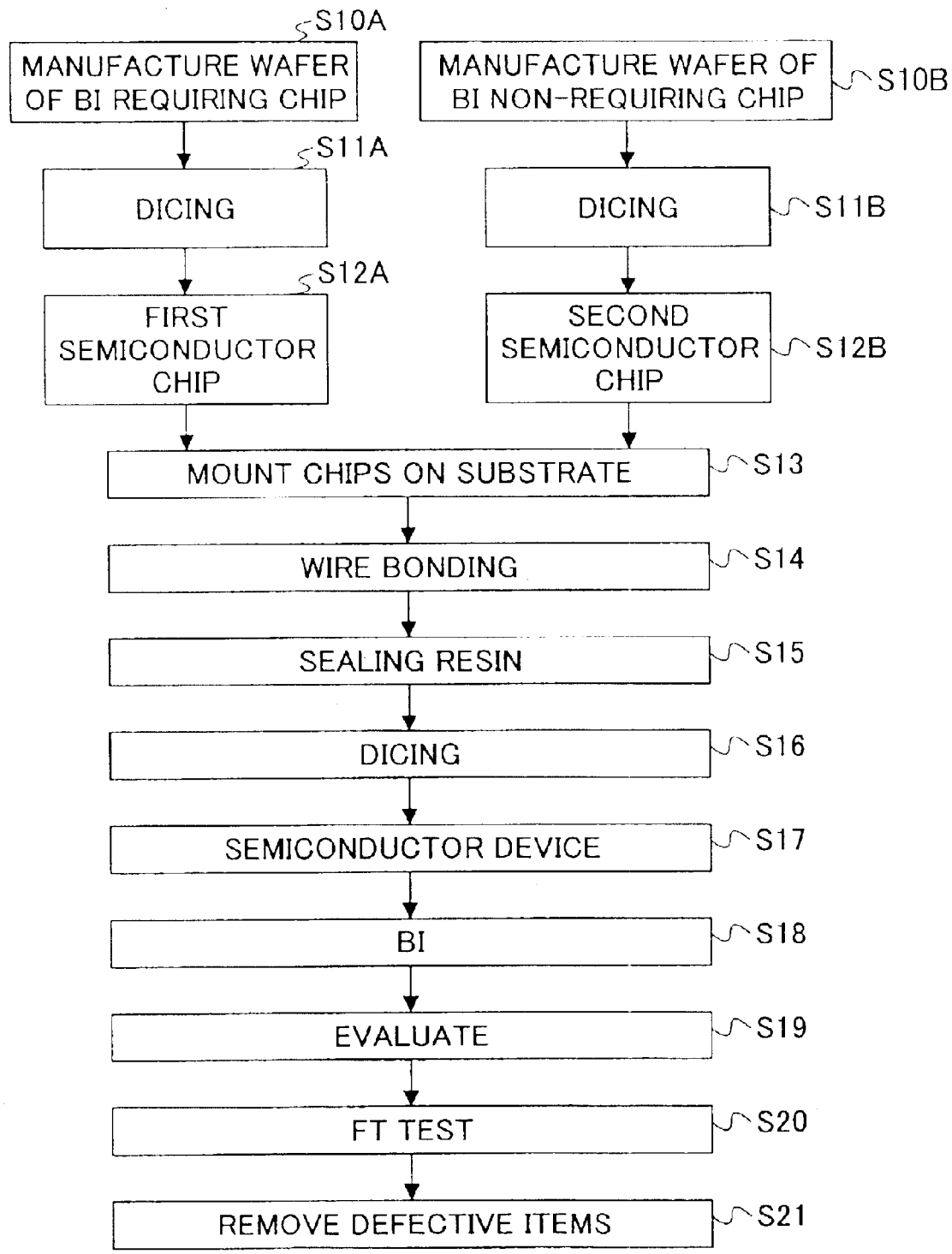
FIG. 3 is a block diagram showing the manufacturing processes of the conventional semiconductor device.
Figure 4:
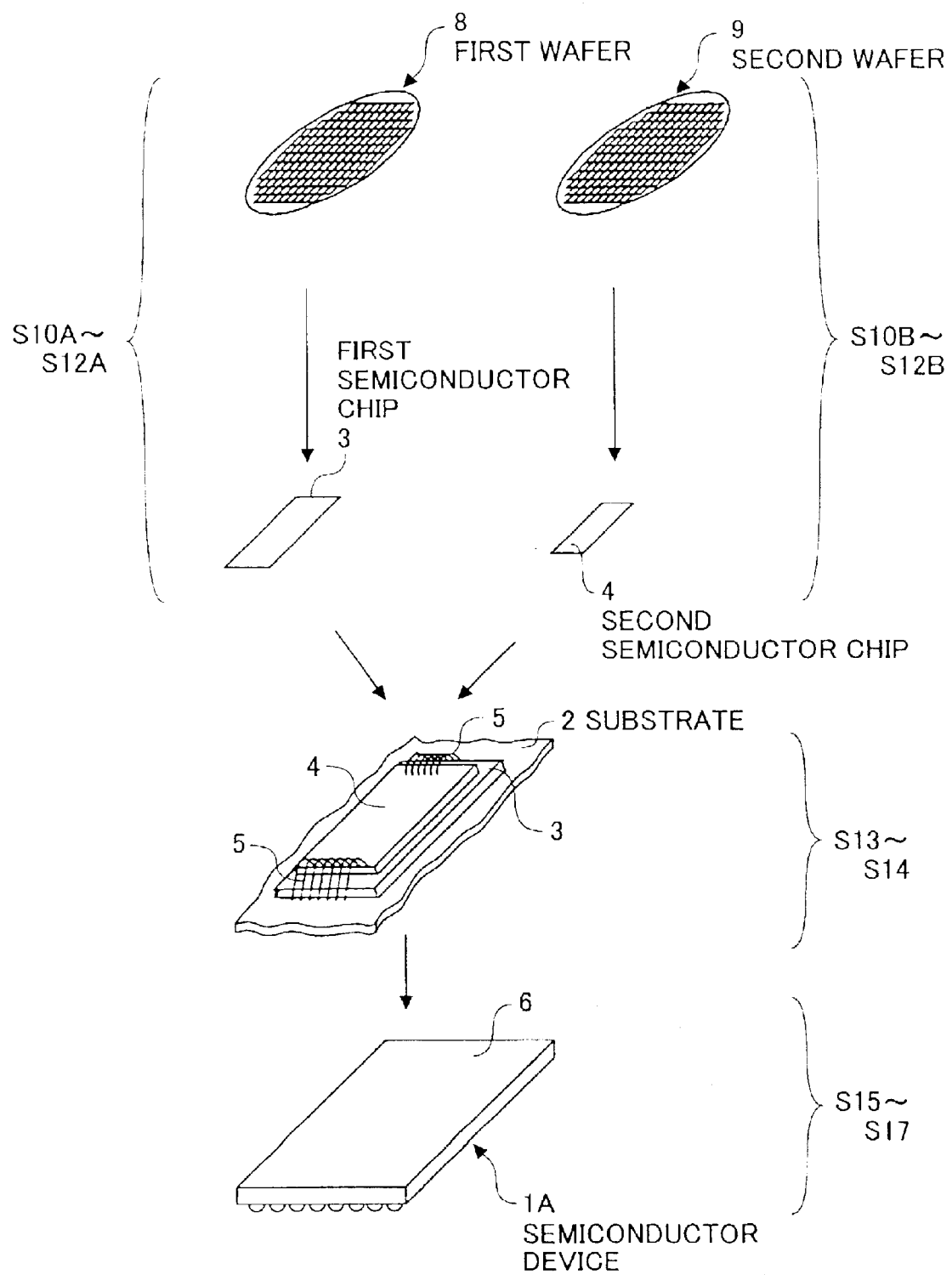
FIG. 4 is a diagram showing the manufacturing method of the conventional semiconductor device in accordance with the processing of manufacturing.
Figure 5:
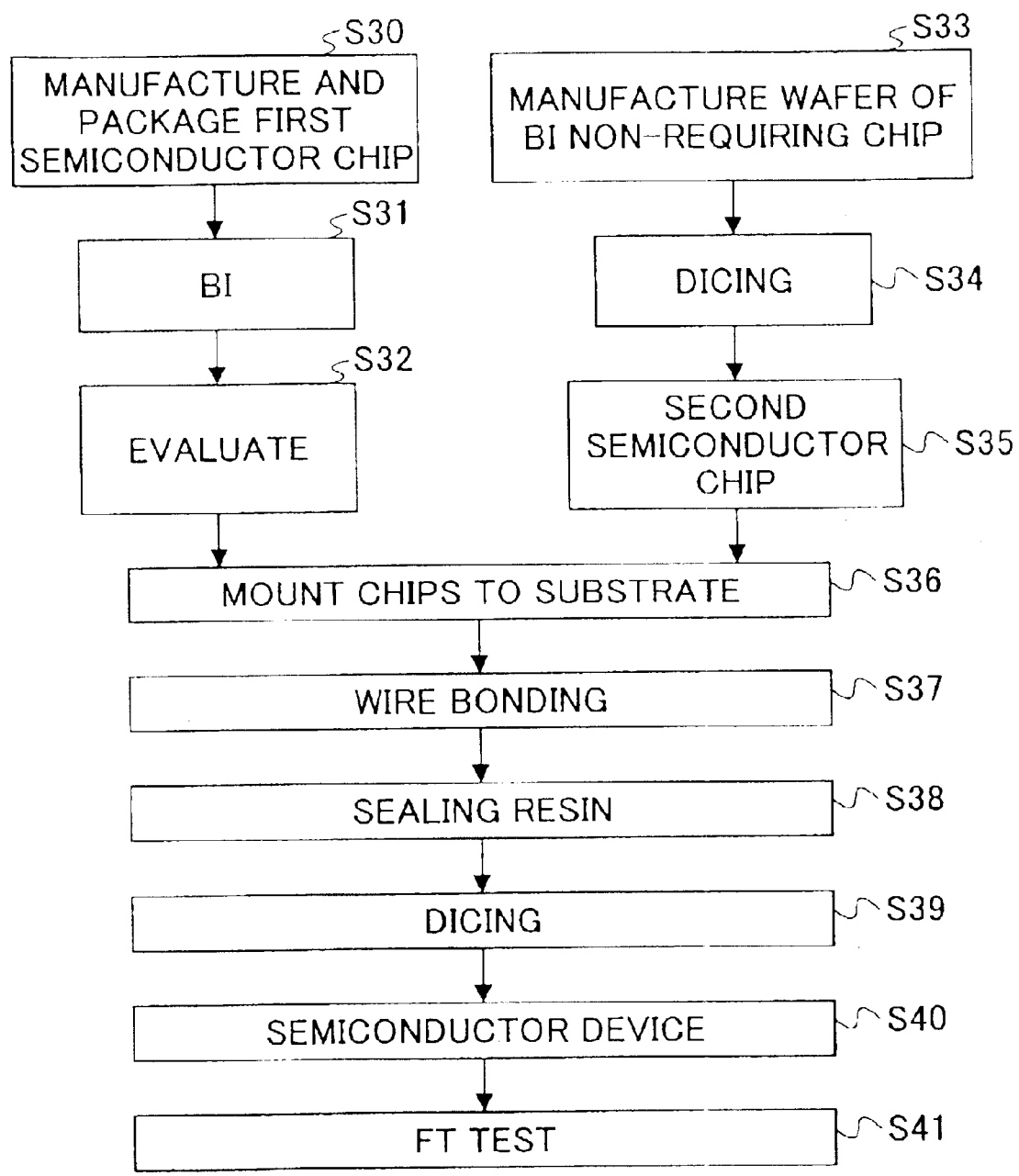
FIG. 5 is a block diagram showing the manufacturing processes of the semiconductor device according to a first embodiment of the present invention.

FIG. 5 through FIG. 7 show a semiconductor device 20A according to a first embodiment of the present invention and a method of manufacturing the same. FIG. 5 is a flow chart showing the manufacturing processes of the semiconductor device 20A, and FIGS. 6 and 7 are schematic diagrams showing the processing of each of the manufacturing processes.

Figure 7A:
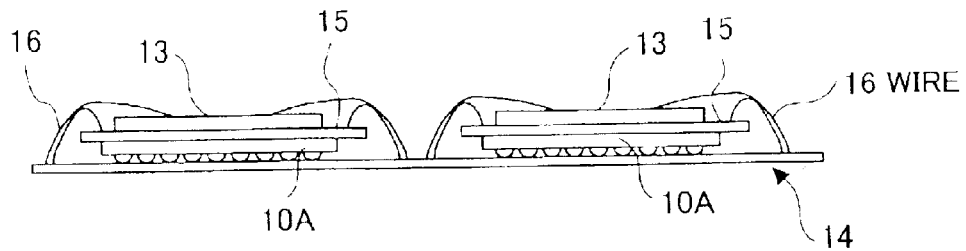
FIGS. 7A through 7D are diagrams showing the manufacturing method according to the first embodiment of the present invention in accordance with the processing of manufacturing.
Figure 7B:
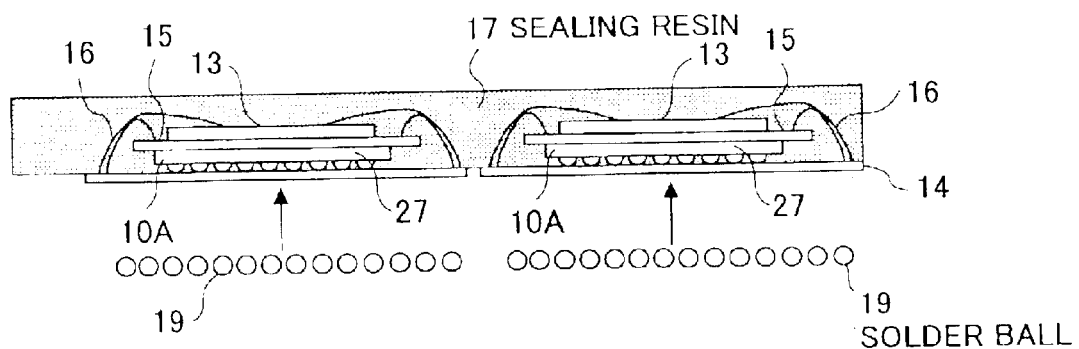
Figure 7C:
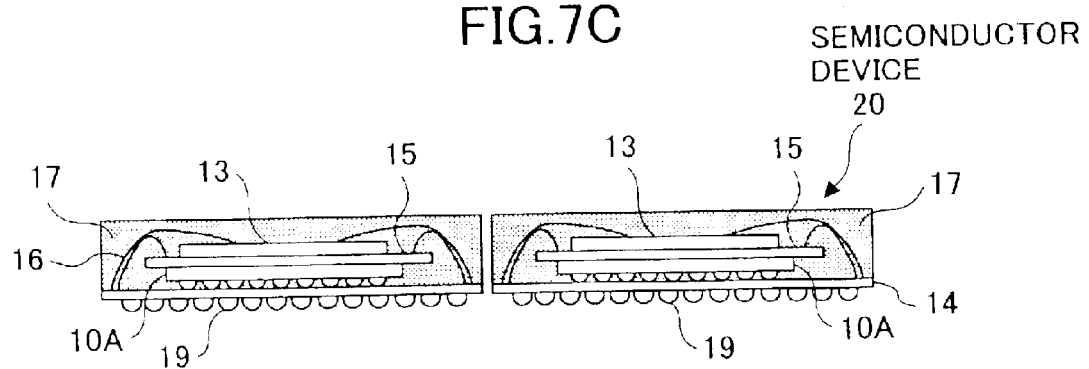
Figure 7D:
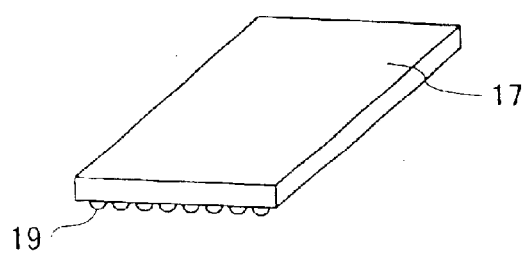

FIG. 7C and FIG. 7D show the semiconductor device 20A. The semiconductor device 20A shown in each of the figures is of MCP structure in which the semiconductor package 10A, and the semiconductor chips 13, and 15 are stacked on the substrate 14, and then sealed with the sealing resin 17.

The semiconductor package 10A, as will be explained hereinafter, is formed by sealing the first semiconductor chip 11 to the resin package 27. In the present embodiment, a chip sized package (CSP) is used as the semiconductor package 10A. The semiconductor package 10A is configured to be electrically connected to the substrate 14.

The second and the third semiconductor chips 13 and 15 are stacked on the top surface of the semiconductor package 10A. Each of the semiconductor chips 13 and 15 are connected to the substrate 14 by wires 16. Furthermore, on the under surface of the substrate 14, solder balls 19, being the external connecting terminals, are provided. The solder balls 19 are electrically connected to the semiconductor package 10A as well as to each of the semiconductor chips 13 and 15 via the substrate 14 and the wires 16.

Now, a method of manufacturing the semiconductor device 20A having the above configuration will be explained.

The semiconductor chips mounted on the semiconductor device 20A are semiconductor chips in which the first semiconductor chip 11, sealed to the semiconductor package 10A, requires a burn-in, and the second and the third semiconductor chips 13 and 15 mounted in a bare-chip state do not require the burn-in. In the present embodiment, the first semiconductor chip 11 requiring the burn-in is sealed to the resin package 27 before being mounted to the substrate 14, and the burn-in is performed on the first semiconductor chip 11 that is sealed to the resin package 27.

In the following description, the semiconductor package 10 (including the non-defective semiconductor package 10A and the defective semiconductor package 10B) refers to the first semiconductor chip 11 sealed to the resin package 27.

S30 through S32 are processes of manufacturing the semiconductor package 10A. To manufacture the semiconductor package 10A, a wafer formed with the first semiconductor chip 11 is first produced. Subsequently, dicing is performed to singularize the wafer into individual first semiconductor chips 11. The semiconductor chip 11 is then manufactured.

In the present embodiment, instead of directly mounting the first semiconductor chip 11 manufactured as above on the semiconductor device 20a in a bare-chip state, the semiconductor package 10A is first prepared by sealing the first semiconductor chip 11 to the resin package 27 and then mounting it on the semiconductor device 20A. For example, the solder balls 18 are formed on the first semiconductor chip 11, in the bare-chip state, and then sealed with resin to form the resin package 27. A semiconductor package 10 of CSP type is then manufactured, as shown in FIG. 6A.

Here, a method of manufacturing the CSP type semiconductor package 10 may be used, where the resin package 27 is formed for the first semiconductor chip 11 on the wafer, and dicing is performed (S30). Alternatively, a commercially available semiconductor package of CSP type such as that shown in FIG. 6A, and which has been sealed to the resin package may be purchased from other companies.

After the semiconductor package 10 has been produced as above, the burn-in is performed on the semiconductor package 10 (S31). This burn-in is performed as one of a screening test; and by performing heating and cooling repeatedly in a predetermined cycle, an initial defect of the defective semiconductor chip 11 is revealed.

Figure 6A:
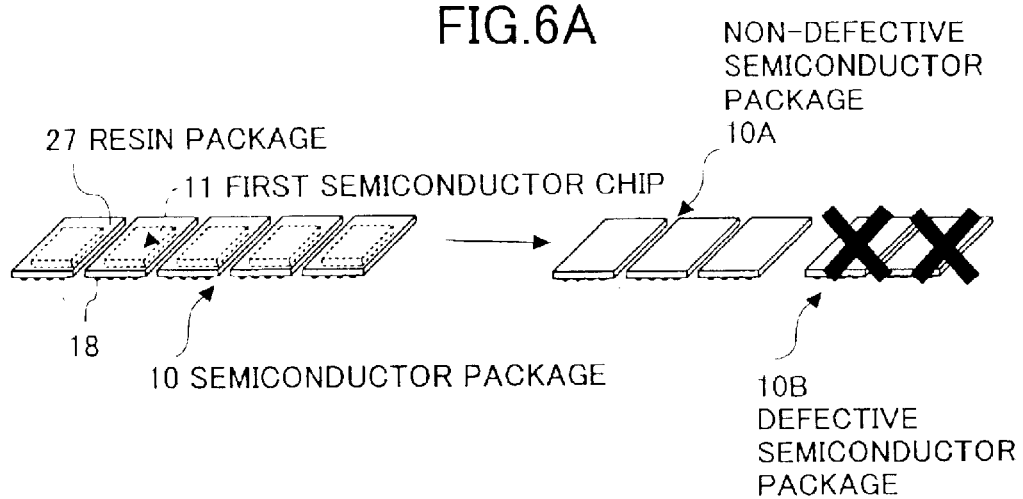
FIGS. 6A through 6D are diagrams showing the manufacturing method of the semiconductor device according to the first embodiment of the present invention in accordance with the processing of manufacturing.

Evaluation is made of the semiconductor package 10 that has been subjected to the burn-in, and the semiconductor package 10 is divided into the non-defective semiconductors 10A and the defective semiconductors 10B, as shown in FIG. 6A (S32). The non-defective package 10A is mounted on the semiconductor device 20A as explained hereinafter, but the defective semiconductor package 10B is removed (S32). Therefore, in the processes that follow, the non-defective semiconductor packages 10A are the only ones used.

Figure 6B:
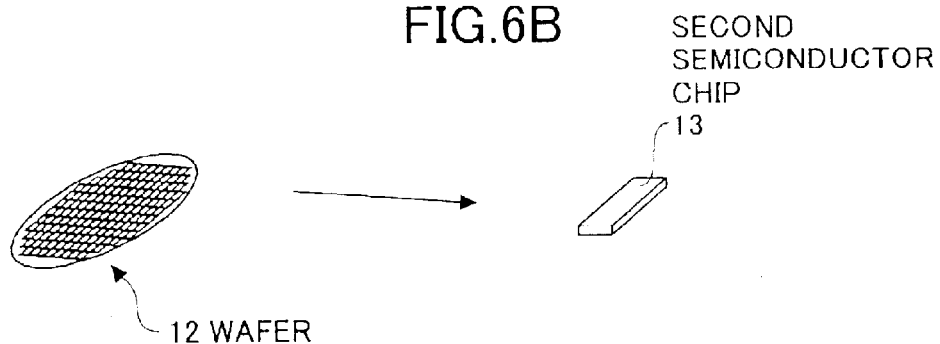

The second and the third semiconductor chips 13 and 15 not requiring the burn-in are manufactured, on the other hand, in the same way as in the conventional manner. In other words, a wafer formed with the second semiconductor chip 13 and a wafer formed with the third semiconductor chip 15 are produced (S33). Dicing is then performed to singularize each of the wafers into individual second and third semiconductor chips 13 and 15, as shown in FIG. 6B (S34). The second and the third semiconductor chips 13 and 15 are then manufactured (S35).

It is to be noted that the phrase "second semiconductor chip not requiring a test" in the Claims refers to the second and the third semiconductor chips 13 and 15 in the present embodiment. Furthermore, the phrase "not requiring a test" means "not requiring a test to exclude initial defects, for example, the burn-in" and does not mean that the test performed on the normal semiconductor chip, for example, the final evaluation test, is not required.

After the non-defective semiconductor package 10A, the second semiconductor chip 13, and the third semiconductor chip 15 are manufactured, as discussed above, the non-defective semiconductor package 10A and each of the semiconductor chips 13 and 15 are mounted on the substrate 14 (S36).

Figure 6C:
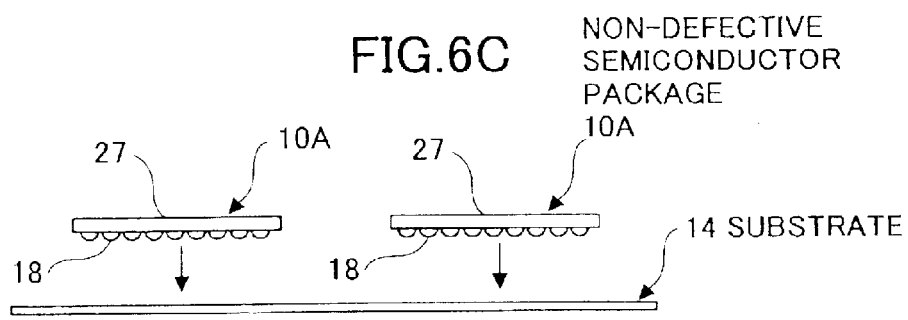

Specifically, the non-defective package 10 determined to be non-defective as a result of the burn-in is mounted on the substrate 14, as shown in FIG. 6C. In the present embodiment, the non-defective package 10A is of CSP structure having solder ball terminals on the under surface thereof, and is electrically connected to the substrate 14 by such solder ball terminals.

Figure 6D:
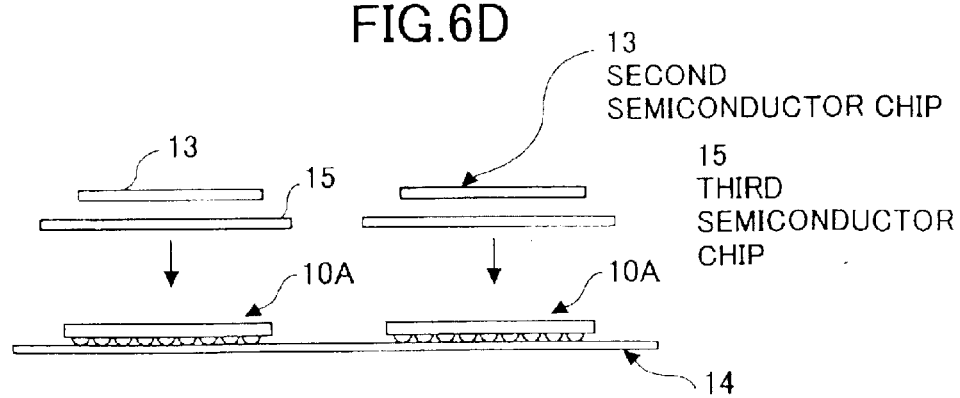

After the non-defective semiconductor package 10A is joined to the substrate 14, the third semiconductor chip 15 is mounted on the top surface of the non-defective semiconductor package 10A, and then the second semiconductor chip 13 is mounted on top of the third semiconductor chip 15 as shown in FIG. 6D. In the present embodiment, three semiconductor chips 11, 13 and 15 are stacked together, making it possible to miniaturize the manufactured semiconductor device 20A and decrease the mounting area.

When mounting each of the semiconductor chips 13 and 15 on the non-defective semiconductor package 10A, each of the semiconductor chips 13 and 15 are mounted so that the circuit-containing face thereof faces upwards, or are in a face-up state. Furthermore, the second semiconductor chip 13 is smaller in shape compared to the third semiconductor chip 15, and thus the electrode of the third semiconductor chip 15 is still exposed even after the second semiconductor chip is stacked thereon. Here, the joining between the non-defective semiconductor package 10A and the third semiconductor chip 15, as well as the joining between the third semiconductor chip 15 and the second semiconductor chip 13 can be performed using an adhesive for die attachment.

After the non-defective semiconductor package 10A as well as the semiconductor chips 13 and 15 are mounted on the substrate 14, wires 16 are bonded between each of the semiconductor chips 13 and 15, and the substrate 14, as shown in FIG. 7A (S37). Afterwards, resin sealing is performed to the substrate 14, and the sealing resin 17 is formed, as shown in FIG. 7B (S38).

In this way, because the non-defective semiconductor package 10A (first semiconductor chip 11) and each of the semiconductor chips 13 and 15 are sealed by the sealing resin 17, the strength of each of the semiconductor chips 11, 13 and 15 against the atmosphere where the semiconductor device 20A is situated and against external force is increased, and thus the reliability of the manufactured semiconductor device 20A is improved.

Furthermore, in the present embodiment, the resin package 27 of the non-defective semiconductor package 10A and the sealing resin 17 are formed so as to have the same coefficient of thermal expansion. To be more precise, the resin package 27 and the sealing resin 17 are made from the same resin. The reason for this will be explained later in the description for the sake of convenience.

As shown in FIG. 7C, the substrate 14 provided with the sealing resin 17 is singularized into individual semiconductor devices 20A by dicing (S39), and the semiconductor device 20A is then manufactured (S40). The semiconductor device 20A manufactured in this way is subjected to a final evaluation test (FT test) such as the electrical property test (S41), and if a defective device is found, such device is removed and the semiconductor device 20A, as shown in FIG. 7D, is completed.

According to the method of manufacturing the semiconductor device 20A according to the present embodiment, the burn-in is carried out in S31, and the non-defective package 10A (the first semiconductor chip) determined to be non-defective in S32 is mounted on the substrate 14 together with the second and the third semiconductor chips 13 and 15 that do not require the burn-in (test), thus manufacturing the semiconductor device 20A. Therefore, after mounting the non-defective package 10A and each of the semiconductor chips 13 and 15 to the substrate 14, forming the sealing resin 17 and thus manufacturing the semiconductor device 20A, there is no longer any need to perform the burn-in on the first semiconductor chip 11.

Therefore, compared to the conventional method of performing the burn-in after the semiconductor chip not subjected to the burn-in, in other words the semiconductor chip not guaranteed in regards to reliability, and the semiconductor chip not requiring the burn-in process are mounted on the substrate, as the burn-in is not performed on the second and the third semiconductor chips 13 and 15, each of the semiconductor chips 13 and 15 that do not require the burn-in are not damaged, and thus the reliability and the yield of the semiconductor device 20A can be improved.

Furthermore, in the present embodiment, the first semiconductor chip 11 determined to be non-defective in the burn-in is mounted on the substrate 14 in a state sealed to the resin package 27. Thus, it becomes possible to prevent the first semiconductor chip 11 from being damaged during mounting and to further improve the manufacturing yield of the semiconductor device 20A compared to when mounting the first semiconductor chip 11 in a bare-chip state.

As mentioned above, in the present embodiment, the sealing resin 17 and the resin package 27 are made of the same material so that the resin package 27 of the non-defective semiconductor package 10 and the sealing resin 17 have the same coefficient of thermal expansion. Thus, even if the first semiconductor chip 11 (i.e., the non-defective package 10A) sealed to the resin package 27 is sealed with the sealing resin 17, the stress caused by the difference in thermal expansion of the sealing resin 17 and the resin package 27 can be prevented from being generated.

Therefore, it becomes possible to prevent damage such as cracks from forming at the interface of the resin package 27 and the sealing resin 17, and thus it becomes possible to improve the reliability of the manufactured semiconductor device 20A. Furthermore, because the sealing resin 17 and the resin package 27 are made of the same material, the adhesion between the sealing resin 17 and the resin package 27 can be improved. Thus, it becomes possible to prevent gaps from forming at or water from entering into the interface between the sealing resin 17 and the resin package 27, thus further improving the reliability of the semiconductor device 20A.

A semiconductor device and a method of manufacturing the same according to a second embodiment of the present invention will now be explained. FIG. 8 shows the semiconductor device 20B and the method of manufacturing the same according to the second embodiment.

The configuration of the semiconductor device 20B and the manufacturing processes for manufacturing the semiconductor device 20B according to the present embodiment are, in many aspects, similar to the configuration of the semiconductor device 20A and the manufacturing processes for manufacturing the semiconductor device 20A according to the first embodiment explained above. Thus, in the following description, those descriptions on the manufacturing processes similar to the processes in the first embodiment will be omitted, and in FIG. 8 onwards, like reference numbers designate the parts corresponding to those shown in FIG. 6 and FIG. 7, referred to in the first embodiment, and thus the description thereof will be omitted.

The semiconductor device 20A according to the first embodiment described above uses the CSP type package structure to seal the first semiconductor chip 11, and such structure is configured to be electrically connected to the substrate 14 via the solder balls 18. On the contrary, the semiconductor device 20B according to the present embodiment uses a SOP (Single Outline Package) type package as the non-defective semiconductor package 21 to seal the first semiconductor chip 11.

The SOP type non-defective semiconductor package 21 uses leads 22 as the external connecting terminals. The leads 22 extend out from the sides of the resin package 27 and are gull-wing shaped to be surface mounted to the substrate 14.

The SOP type non-defective semiconductor package 21 is also subjected to the burn-in as in the first embodiment, and only the non-defective ones determined as a result of the burn-in are mounted to the substrate 14. FIG. 8A shows the first semiconductor chip 11, determined to be non-defective, mounted to the substrate 14. The joining between the substrate 14 and the leads 22 is carried out by applying soldering cream to the leads 22 joining location of the substrate 14 beforehand, temporarily fixing the leads 22 to the soldering cream, and then passing the substrate 14 through the reflow furnace and soldering the leads 22 to the substrate 14.

After the non-defective semiconductor package 21 is joined to the substrate 14, the second and the third semiconductor chips 13 and 15 not requiring the burn-in are mounted to the non-defective semiconductor package 21, as shown in FIG. 8B. Each of the semiconductor chips 13 and 15 and the substrate 14 are connected by wires 16, as shown in FIG. 8C.

The sealing resin 17 is formed on the substrate 14 provided with the non-defective package 21 and the semiconductor chips 13 and 15, while the solder balls 19, being the external connecting terminals, are provided on the under surface of the substrate 14, as shown in FIG. 8D. Next, dicing for singularizing into individual semiconductor devices 20B is performed and the semiconductor device 20B is then manufactured, as shown in FIG. 8E.

According to the semiconductor device 20A and the method of manufacturing the same of the present embodiment, the non-defective semiconductor package 21 internally provided with the first semiconductor chip 11 has leads 22. Since leads 22 are soldered to the substrate 14, even if there is a difference in thermal expansion between the non-defective semiconductor package 21 and the substrate 14, the stress generated by such difference in the coefficient of thermal expansion is absorbed by making the leads 22 be elastically deformable. Thus, the reliability of the semiconductor device 20B is improved.

Figure 10A:
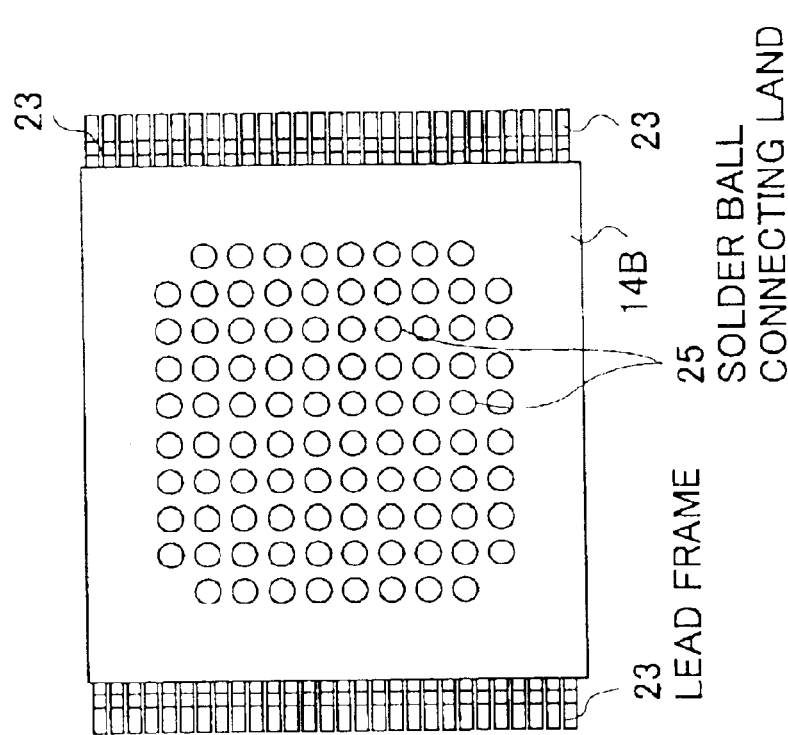
FIGS. 10A and 10B are enlarged views of a substrate used in the third embodiment of the present invention.
Figure 10B:
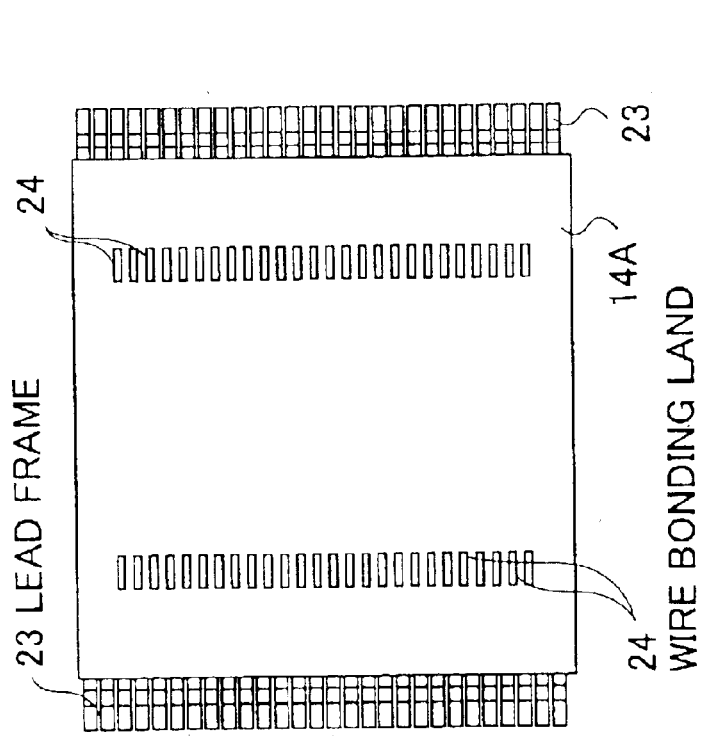
Figure 11:
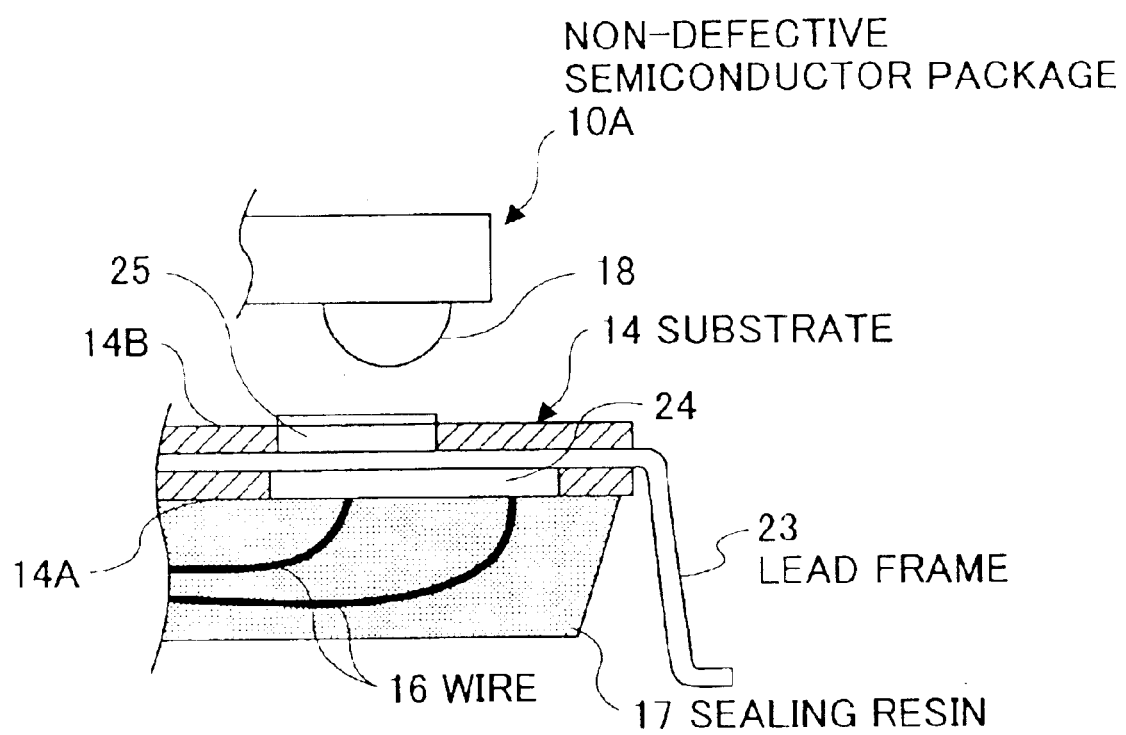
FIG. 11 is an enlarged view showing a joining part of the semiconductor package and the substrate in the third embodiment of the present invention.
Figure 12A:
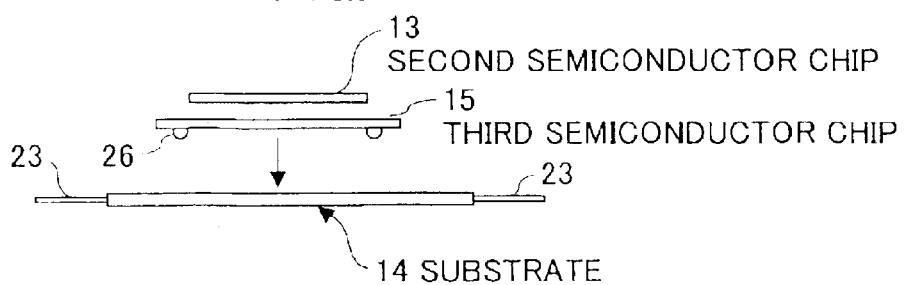
FIGS. 12A through 12E are diagrams showing the manufacturing method of the semiconductor device according to a fourth embodiment of the present invention in accordance with the processing of manufacturing.
Figure 12B:
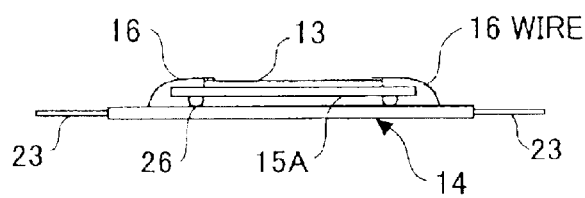
Figure 12C:
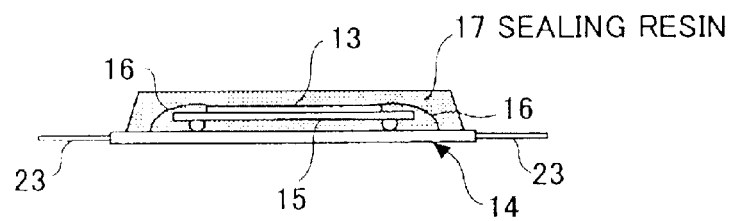
Figure 12D:
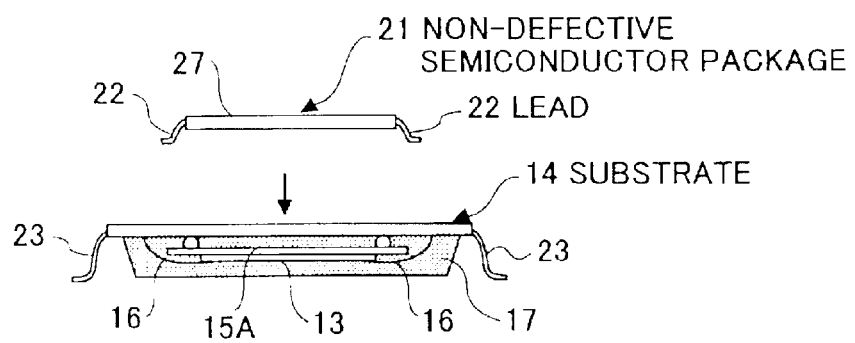
Figure 12E:
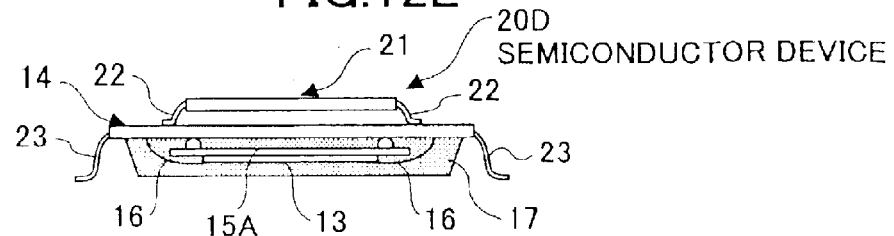

A semiconductor device and a method of manufacturing the same according to a third embodiment of the present invention will now be explained. FIG. 9 through FIG. 11 show the semiconductor device 20C and the method of manufacturing the same according to the third embodiment.

The semiconductor device 20C according to the present embodiment is characterized in that the second and the third semiconductor chips 13 and 15 are arranged on the back surface 14A of the substrate 14, and the non-defective semiconductor package 10A is mounted on the front surface 14B of the substrate 14. Furthermore a substrate having a lead frame 23 is used as the substrate 14.

The substrate 14 having the lead frame 23 is formed with, on the back surface 14A, wire bonding lands 24 where wires 16 are bonded, and is formed with, on the front surface 14B, solder ball connecting lands 25 where non-defective semiconductor package 10A is connected, as shown in the enlarged views of FIG. 10 and FIG. 11. Moreover, the lead frame 23 is electrically connected to both the wire bonding lands 24 and the solder ball connecting lands 25 while the part extending out laterally is bent in a gull-wing shape.

Figure 9A:
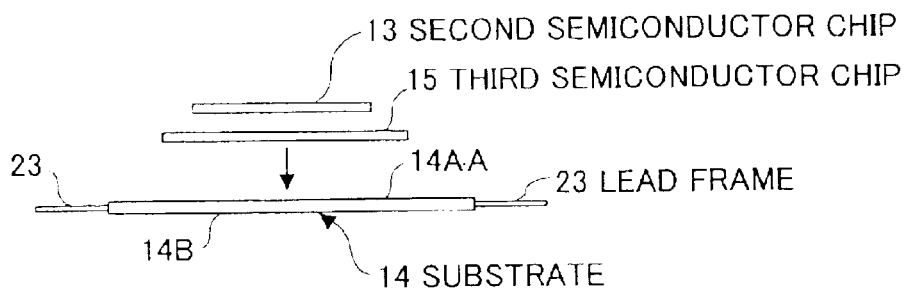
FIGS. 9A through 9E are diagrams showing the manufacturing method of the semiconductor device according to a third embodiment of the present invention in accordance with the processing of manufacturing.
Figure 9B:
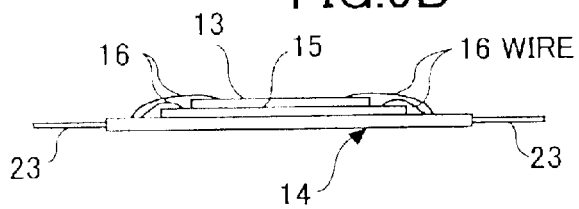
Figure 9C:
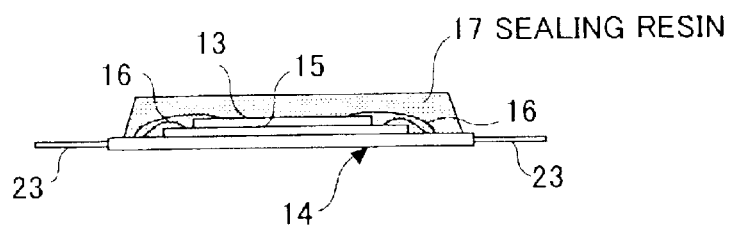

To manufacture the semiconductor device 20C, the third semiconductor chip 15 and the second semiconductor chip 13 are mounted to the substrate 14 using an adhesive so as to form a stacked layer while the lead frame 23 is in a non-bent state, as shown in FIG. 9A. Subsequently, each of the semiconductor chips 13 and 15 and the substrate 14 are connected by wires 16, as shown in FIG. 9B, and then sealing resin 17 is formed, as shown in FIG. 9C.

Figure 9D:
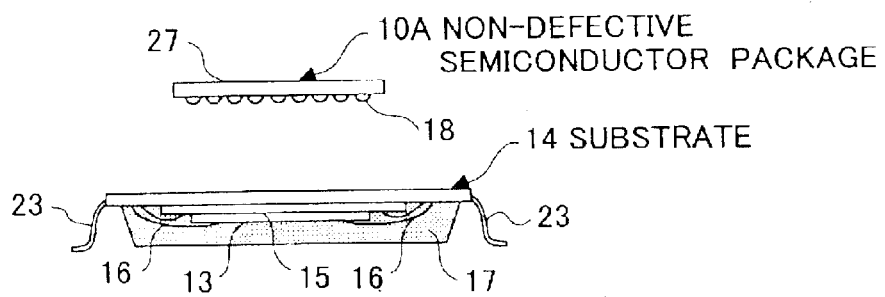
Figure 9E:
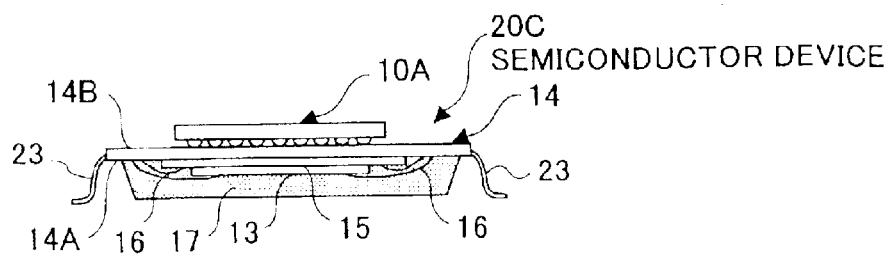

After the sealing resin 17 is formed as described above, the substrate 14 is turned upside down, and the lead frame 23 shaping process is performed. The non-defective semiconductor package 10A is flip-chip joined to the back surface 14A of the substrate 14, as shown in FIG. 9D. The semiconductor device 20C is then manufactured, as shown in FIG. 9E.

The semiconductor device 20C according to the present embodiment is provided with the non-defective semiconductor package 10A on the back surface 14A of the substrate 14, and is provided with the second and the third semiconductor chips 13 and 15 on the front surface 14B of the substrate 14. In this way, the semiconductor device 20C can be miniaturized and the mounting area can be decreased.

A semiconductor device and a method of manufacturing the same according to a fourth embodiment of the present invention will now be explained. FIG. 12 shows the semiconductor device 20D and the method of manufacturing the same according to the fourth embodiment.

The semiconductor device 20D according to the present embodiment has substantially the same configuration as the semiconductor device 20C according to the third embodiment described above. However, the respective semiconductor devices are different in that the semiconductor device 20C according to the third embodiment has the non-defective semiconductor package 10A electrically connected to the substrate 14 via the solder balls 18, whereas the semiconductor device according to the present embodiment uses the non-defective package 21 with leads 22, by which the non-defective package is surface mounted to the substrate 14. Furthermore, in the semiconductor device 20C according to the third embodiment, the third semiconductor chip 15 is connected to the substrate 14 by wires 16, whereas in the present embodiment, the third semiconductor chip 15A is provided with solder balls 26 and is flip-chip joined to the substrate 14 with such solder balls.

In the semiconductor device 20D according to the fourth embodiment, by having the non-defective semiconductor package 21 and each of the semiconductor chips 13 and 15 mounted on the top side and the under side, respectively, with the substrate 14 in between, the semiconductor device 20C can be miniaturized and the mounting area can be decreased.

With the present invention, various advantages such as those listed below can be achieved.

According to the present invention, compared to a method of performing a test after mounting the first and the second semiconductor chips onto the substrate, the yield of the semiconductor device is improved because the second semiconductor chip is not damaged by the test.

Furthermore, the first semiconductor chip determined to be non-defective in the test is mounted to the substrate in a state sealed to a package, and thus compared to being mounted in a bare-chip state, the first semiconductor chip is prevented from being damaged during mounting and the yield of the semiconductor device is further improved.

Furthermore, as the first semiconductor chip and the second semiconductor chip are sealed with the sealing resin, the strength of each of the semiconductor chips against the atmosphere in which the semiconductor device is situated and against external force increases and the reliability of the semiconductor device to be manufactured is improved.

According to the present invention, the stress caused by the difference in thermal expansion between the package and the sealing resin can be prevented. Thus, damage such as cracks is prevented from forming at the interface between the package and the sealing resin and the reliability of the semiconductor device to be manufactured is improved.

According to the present invention, in addition to preventing damage such as cracks from forming at the interface of the package and the sealing resin, by forming the package and the sealing resin with the same material, the adhesion between the two is improved and thus gaps are prevented from forming at or water is prevented from entering into the interface of the package and the sealing resin.

According to the present invention, the reliability of the semiconductor device is improved.

According to the present invention, the semiconductor device having such high reliability as discussed above can be miniaturized.

The present invention is not limited to these embodiments, but variations and modifications may be made without departing from the scope of the present invention.

What is claimed is:

1. A semiconductor device comprising:

a first semiconductor package comprising a first semiconductor chip sealed in a first resin;

a second semiconductor chip; and a substrate on which said first semiconductor package and said second semiconductor chip are mounted; wherein said first semiconductor package and said second semiconductor chip are sealed in a second resin.

2. The semiconductor device as claimed in claim 1, wherein said first semiconductor chip is determined to be non-defective in a test; and said second semiconductor chip does not require said test.

3. The semiconductor device as claimed in claim 1, wherein a coefficient of thermal expansion of said first resin and a coefficient of thermal expansion of said second resin are substantially the same.

4. The semiconductor device as claimed in claim 1, wherein said first resin and said second resin are made of the same material.

5. The semiconductor device as claimed in claim 1, wherein said first semiconductor chip and said second semiconductor chip are stacked.

* * * * *